United States Patent
Wan

(10) Patent No.: US 11,409,932 B1
(45) Date of Patent: Aug. 9, 2022

(54) C-PHY INPUT/OUTPUT DRIVER MODELING USING ARTIFICIAL NEURAL NETWORK AND STATE SPACE MODELS

(71) Applicant: Ansys, Inc., Canonsburg, PA (US)

(72) Inventor: Shan Wan, Saratoga, CA (US)

(73) Assignee: Ansys, Inc., Canonsburg, PA (US)

( * ) Notice: Subject to any disclaimer, the term of this patent is extended or adjusted under 35 U.S.C. 154(b) by 1124 days.

(21) Appl. No.: 15/844,704

(22) Filed: Dec. 18, 2017

Related U.S. Application Data

(60) Provisional application No. 62/436,057, filed on Dec. 19, 2016.

(51) Int. Cl.
*G06F 13/40* (2006.01)
*G06F 30/367* (2020.01)
*G06N 20/00* (2019.01)
*G06F 30/33* (2020.01)

(52) U.S. Cl.
CPC ........ *G06F 30/367* (2020.01); *G06F 13/4063* (2013.01); *G06F 30/33* (2020.01); *G06N 20/00* (2019.01)

(58) Field of Classification Search
None
See application file for complete search history.

(56) References Cited

U.S. PATENT DOCUMENTS

2019/0180179 A1* 6/2019 Beyene .................... G06F 1/26

OTHER PUBLICATIONS

Mutnury, Bhyrav, Madhavan Swaminathan, Moises Cases, Nam Pham, Daniel N. De Araujo, and Erdem Matoglu. "Modeling of power supply noise with non-linear drivers using recurrent neural network (RNN) models." In Proceedings Electronic Components and Technology, 2005. ECTC'05., pp. 740-745. IEEE, 2005 (Year: 2005).*

Yogesh Chaudhary, "Solutions to Resolve Traditional PHY Verification Challenges" as archived on Aug. 1, 2016 at web.archive.org/web/20160801021330/https://www.design-reuse.com/articles/38951/solutions-to-resolve-traditional-phy-verification-challenges.html [obtained Feb. 13, 2021], 2016, 5 pages (Year: 2016).*

Barry Katz and Todd Westerhoff, "System Level Timing Closure using HSPICE", SNUG San Jose 2007, 2007, 13 pages (Year: 2007).*

Dghais, W. "Macromodeling of Digital I/O Buffers." Electrónica E Telecomunicações 5, No. 2 (2010): 259 (Year: 2010).*

(Continued)

*Primary Examiner* — Boris Gorney
*Assistant Examiner* — Robert S Brock
(74) *Attorney, Agent, or Firm* — Jones Day

(57) ABSTRACT

Systems and methods are provided herein for estimating an output current of an input/output (I/O) driver given a set of voltages present at pins of the I/O driver. A set of voltages are received comprising voltages present at a power pin, a ground pin, at least three input pins, and at least three output pins of an I/O driver. Neural network models are applied to one or more voltages of the set of voltages to determine currents associated the I/O driver. A state space model is applied to one or more voltages of the set of voltages to determine another current of the I/O driver. An output current of the I/O driver is estimated based on the currents and the one or more values.

22 Claims, 12 Drawing Sheets

(56) References Cited

OTHER PUBLICATIONS

Rawat, Meenakshi, and Fadhel M. Ghannouchi. "Distributed spatiotemporal neural network for nonlinear dynamic transmitter modeling and adaptive digital predistortion." IEEE transactions on instrumentation and measurement 61, No. 3 (2011): 595-608 (Year: 2011).*

Stievano, I. S., I. A. Maio, and F. G. Canavero. "Accurate and Efficient Parametric Macromodeling of IC Drivers via Sigmoidal Basis Functions." In Proc. of 7th IEEE Workshop on Signal Propagation on Interconnects, Siena, I, pp. 57-60. 2003 (Year : 2003).*

Canavero, F. G., I. A. Maio, and I. S. Stievano. "Mπlog, Macromodeling via Parametric Identification of Logic Gates.", IEEE Transactions on Advanced Packaging, vol. 27, No. 1, Feb. 2004, pp. 15-23 (Year: 2004).*

* cited by examiner

C-PHY INPUT/OUTPUT DRIVER MODELING USING ARTIFICIAL NEURAL NETWORK AND STATE SPACE MODELS

CROSS-REFERENCE TO RELATED APPLICATIONS

This application claims priority to U.S. Provisional Application No. 62/436,057, entitled "C-PHY INPUT/OUTPUT DRIVER MODELING USING ARTIFICIAL NEURAL NETWORK AND STATE SPACE MODELS," filed Dec. 19, 2016, the entirety of which is herein incorporated by reference.

TECHNICAL FIELD

The present disclosure relates generally to the field of computational simulations, and, more specifically, to processor-implemented systems and methods for C-PHY input/output driver modeling using artificial neural networks and state space models.

BACKGROUND

An Input/Output Buffer Information Specification (IBIS) provides information regarding input and output buffers of integrated circuit devices. An IBIS provides insight into the electrical characteristics of the integrated circuitry that can be used, for example, to characterize device behavior. In some cases, using an IBIS for complex device modeling can have limited accuracy (e.g., in modeling devices which exhibit behaviors such as simultaneous switching outputs (SSO) or simultaneous switching noise (SSN), etc.). In other cases, an IBIS may not exist for a particular device.

An example device where an IBIS currently does not exist is a C-PHY transmitter. C-PHY transmitters are used in Mobile Industry Processer Interfaces (MIPIs). C-PHY transmitters include three input pins and three output pins that share the same power and grounding pins. Transmission rates for C-PHY devices are greater than 1 bit per symbol. High speed modes for C-PHY may provide for more complex signaling.

SUMMARY

In one aspect, an output current of an input/output (I/O) driver is estimated given a set of voltages present at pins of the I/O driver. A set of voltages is received, the set of voltages comprising voltages present at a power pin, a ground pin, at least three input pins, and at least three output pins of an I/O driver. A first neural network model is applied to one or more voltages of the set of voltages to determine a first current associated with switching noise in the I/O driver. A second neural network model is applied to one or more voltages of the set of voltages to determine a second current that is a DC current of the I/O driver given static voltages present at the at least three input pins. A state space model is applied to one or more voltages of the set of voltages to determine a third current resulting from variation in the voltages present at the power, ground, at least three output pins of the I/O driver. A third neural network model is applied to one or more voltages of the set of voltages to determine one or more values representative of a switching behavior of the I/O driver. An output current of the I/O driver is estimated based on the first, second, and third currents and the one or more values. In some variations, the I/O driver can be a C-PHY IO driver.

In some variations, the output current can be determined based on a summation operation.

In some variations the neural network model can include an input layer, a hidden layer, and an output layer. The hidden layer can include hidden layer elements, each hidden layer element can determine an output activation signal provided to the output layer. The output activation signal can be determined by application of an activation function to a weighted transfer function output based on the inputs to each hidden layer element. In some variations, the activation function can be a sigmoid function.

In other variations, the state space model can determine a plurality of model parameters using a gradient-based algorithm.

In some variations, systems can be provided for implementing various operations described herein that include at least one data processor and memory. In other variations, the various operations described herein occur in a simulation environment.

Non-transitory computer program products (i.e., physically embodied computer program products) are also described that store instructions, which when executed by one or more data processors of one or more computing systems, cause at least one data processor to perform operations herein. Similarly, computer systems are also described that can include one or more data processors and memory coupled to the one or more data processors. The memory can temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The subject matter described herein provides many technical advantages. One technical advantage includes the ability to model a transmitter driver cell at the macro level using feed forward artificial neural networks and state space models. Through the combination of state space models and artificial neural network models, devices can be modeled without the use of an IBIS.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

Like reference symbols in the various drawings indicate like elements.

DETAILED DESCRIPTION

In the absence of an IBIS, various modeling schemes may be used to model the behavior of a device. The methods, systems, and devices described herein provide macro-level modeling of transmitter devices having at least three input and outputs, such as the C-PHY transmitter. Exemplary models described herein utilize a combination of artificial neutral network and state space models as sub-models that are trained based on various training data. The outputs of the multiple sub-models are combined together to estimate an output current of the transmitter driver cell.

Figure 1:
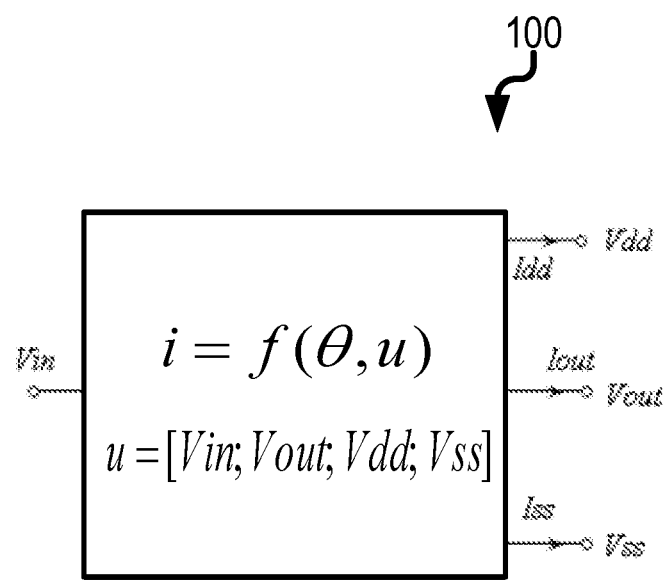
FIG. 1 depicts an example block diagram of a transistor driver cell model.

FIG. 1 depicts an example block diagram 100 of a transistor driver cell model. Model inputs, u, include voltage input, $V_{in}$, voltage output, $V_{out}$, power supply voltage, $V_{dd}$, and ground supply voltage, $V_{ss}$. Voltage input, $V_{in}$, represents the combined input voltage of at least three input pins of the transistor cell device. Voltage output, $V_{out}$, represents the combined output voltage of at least three output pins of the transistor driver cell. The C-PHY transmitter described herein is an example of a transistor cell device including three input pins for receiving three input voltages and three output pins for providing three output voltages. The model output, i, is the power supply current, $I_{dd}$, the ground supply current, $I_{ss}$, or the current output, $I_{out}$. Parametric model, f, includes both artificial neural network and state space sub-models. Model parameters, Θ, include coefficients of the artificial neural network and state space sub-models, described in further detail below.

Figure 2:
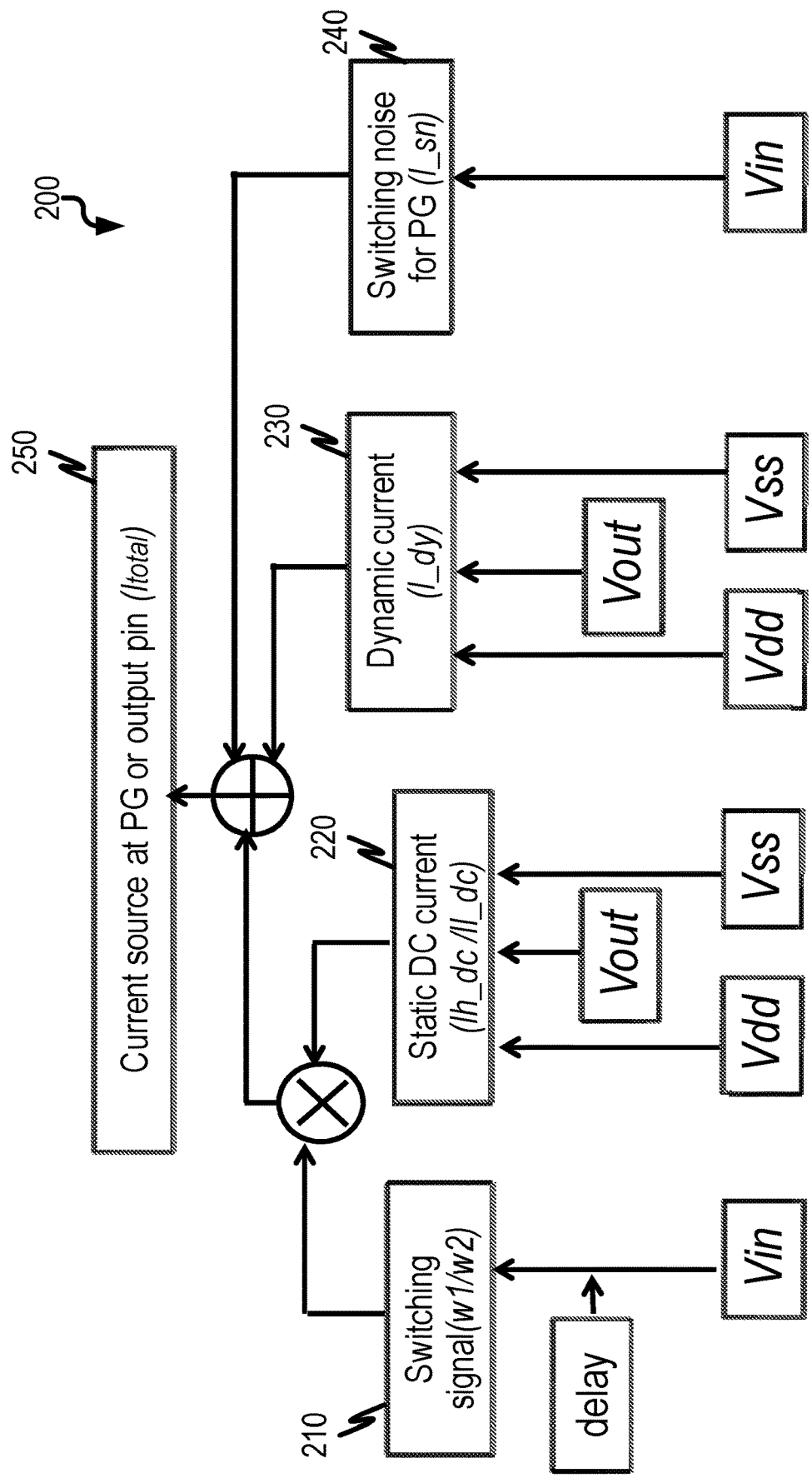
FIG. 2 depicts an example current source topology for a chip input output model.

FIG. 2 depicts an example current source topology 200 for a chip input output model (CIOM). In some embodiments, the CIOM of FIG. 2 is used in modeling a C-PHY transmitter, as described herein. The current source topology 200 can be divided into multiple sub-models: (i) switching signal sub-model 210, (ii) static Direct Current (DC) sub-model 220, (iii) dynamic current sub-model 230, and (iv) switching noise sub-model 240. Each sub-model comprises either an artificial neural network model or a state space model. The sub-models are trained such that model parameters for each of the respective sub-models are optimized relative to error criteria. The outputs of the sub-models 220, 230, 240 comprise currents, while the output of the sub-model 210 comprises a ratio of two scalar values (i.e., w1/w2, shown in FIG. 2), as described in further detail below. The outputs of the sub-models 210, 220, 230, 240 are combined to generate a total output current, $I_{total}$, representative of a current value at the current output pin, the power supply current pin, or the ground supply current output pin of the I/O driver as follows:

$$I_{total} = (w1 * Ih_{dc})(w2 * Il_{dc}) + I_{dy} + I_{sn} \qquad (1)$$

where: $Ih_{dc}$ is the DC current when input voltage is static high; $Il_{dc}$ is the DC current when input voltage is static low; $I_{dy}$ is the current due to the variation of the output voltage, power supply voltage, and ground voltage; $I_{sn}$ is the accumulated current due to the transmitter cell driver's previous stages switching, passed to the last stage power and ground pins; and w1 and w2 are scalar values continuously varying between 0 and 1 to control switching of $Ih_{dc}$ and $Il_{dc}$.

The switching signal sub-model 210 comprises an artificial neural network model configured to receive a $V_{in}$ voltage value subject to a delay. The delay can be the time difference between transition starting points of input voltage waveform and output current waveform. $V_{in}$ represents the input voltages present at the at least three input pins of the transistor cell device. For example, for a C-PHY cell having three input pins can be represented by a matrix such as $$V_{in} = [V_{in@input\_pin1}, V_{in@input\_pin2}, V_{in@input\_pin3}]. \qquad (2)$$

In some embodiments, the delayed $V_{in}$ voltage is extracted from a transient simulation. An output of the switching signal sub-model 210 is a ratio between w1 and w2, as seen in the figure.

The Static DC current sub-model 220 also comprises an artificial neural network model, in embodiments, and is configured to receive inputs $V_{dd}$, $V_{ss}$, and $V_{out}$, as shown in the figure. $V_{dd}$ represents a power supply voltage, $V_{ss}$ represents a ground supply voltage, and $V_{out}$ represents the output voltages present at the at least three output pins of the transistor cell device. In some embodiments, the inputs to the static DC current sub-model 220 are extracted from a DC simulation. An output of the static DC current sub-model 220 is a ratio between $Ih_{dc}$, and $Il_{dc}$, as seen in the figure.

Like the sub-models 210, 220, the noise current sub-model 240 comprises an artificial neural network model. In embodiments, the noise current sub-model 240 is configured to receive the $V_{in}$ voltage as an input, where such input may be extracted from a transient simulation. An output of the noise current sub-model 240 is $I_{sn}$, which is the accumulated current due to the transmitter cell driver's previous stages switching, passed to the last stage power and ground pins, as noted above.

The dynamic current sub-model 230 comprises a state space model, in embodiments. The dynamic current sub-model 230 is configured to receive inputs $V_{dd}$, $V_{ss}$, and $V_{out}$, as shown in the figure. In some embodiments, the inputs to the static dynamic current sub-model 230 are extracted from a transient simulation. An output of the dynamic current sub-model 230 is $I_{dy}$, which is the current due to the variation of the output voltage, power supply voltage, and ground voltage, as noted above.

In embodiments, the four sub-models 210, 220, 230, 240 are collectively used to model a C-PHY transmitter. As described above and shown in FIG. 2, each of the sub-models 210, 220, 230, 240 (i) receives one or more inputs, and (ii) generates an output based on the inputs. The outputs are combined according to Equation 1 above to provide $I_{total}$, the total current at the output, power, or ground pin. In embodiments, the four sub-models 210, 220, 230, 240 are used to model simultaneous switching outputs/simultaneous switching noise (SSO/SSN) of a C-PHY transmitter.

Each of the sub-models 210, 220, 230, 240 is trained using training data to determine optimized model parameters within certain error criteria. The training data is generated through the use of simulation environment software such as Simulation Program with Integrated Circuit Emphasis (SPICE). Each data generation model can have initial setup and input files such as a device model file and a SPICE netlist file associated with the transistor driver cell, nominal voltage setups of cell pins, SPICE environmental parameters such as temperature and/or stimulus frequency, and other optional SPICE setup parameters. The generation of training data for training the sub-models 210, 220, 230, 240 is described below with reference to FIGS. 3A-6B.

Figure 3A:
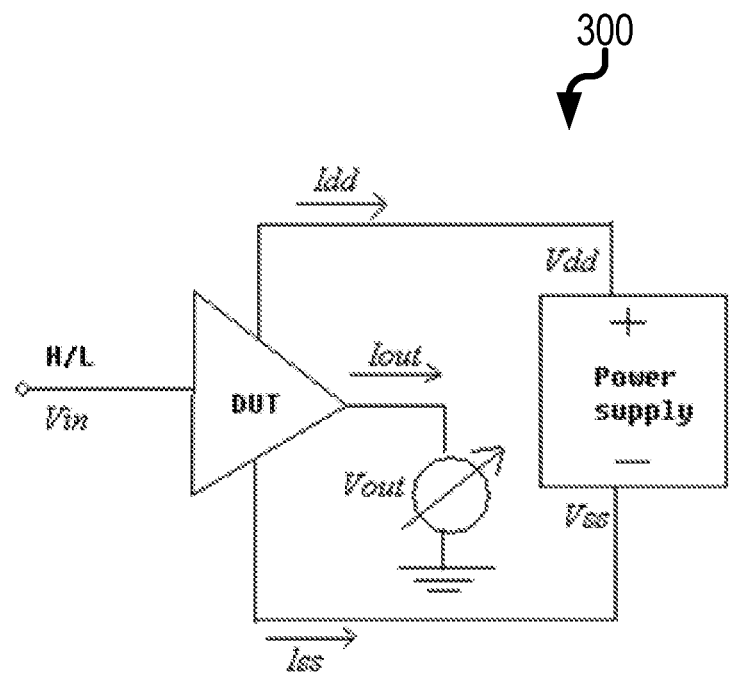
FIG. 3A depicts an example static DC data generation model.
Figure 3B:
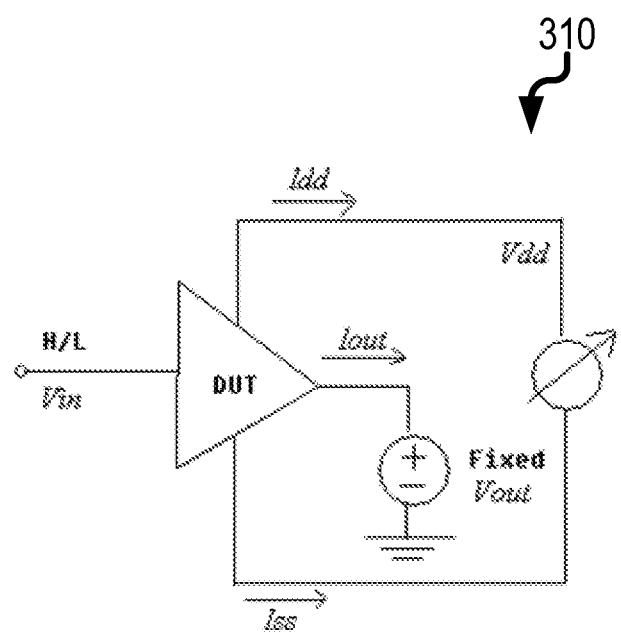
FIG. 3B depicts another example static DC data generation model.

FIG. 3A and FIG. 3B depict two variations of static DC data generation models: ideal power supply static DC data generation model 300 and fixed output voltage data generation model 310. In training the artificial neural network of the above-described static DC current sub-model 220, the output of one or both of models 300, 310 are used to provide training data. To obtain the outputs of the respective data generation models 300, 310, SPICE simulation parameters are set as follows: (i) voltage input, $V_{in}$, into a Device Under Test (DUT) is set to a constant value using high/low logic, and the DUT is connected to power supply voltage, $V_{dd}$, and voltage output, $V_{out}$, as shown in the figure, (ii) in FIG. 3A, the ideal power supply static DC data generation model 300 has a fixed ideal power supply voltage value, and a DC sweep is performed over the voltage output, $V_{out}$, and (iii) in FIG. 3B, the fixed output voltage data generation model 310 has a fixed value of voltage output, $V_{out}$, and a DC sweep is performed over the power supply voltage, $V_{dd}$.

Using these SPICE simulation parameters, total DC current (e.g., $I_{dc}$, which can be $I_{ss}$, $I_{dd}$, or $I_{out}$, as shown in FIGS. 3A and 3B) at the PG and output nodes is obtained according to High/Low input. Voltages including voltage output, $V_{out}$, power supply voltage, $V_{dd}$, and ground supply voltage, $V_{ss}$, can be converted into a transistor drain-source current, $V_{DS}$. The total DC current $I_{dc}$ and the transistor drain-source current $V_{DS}$ comprise training data used to train the artificial neural network of the static DC current sub-model 220.

Figure 4:
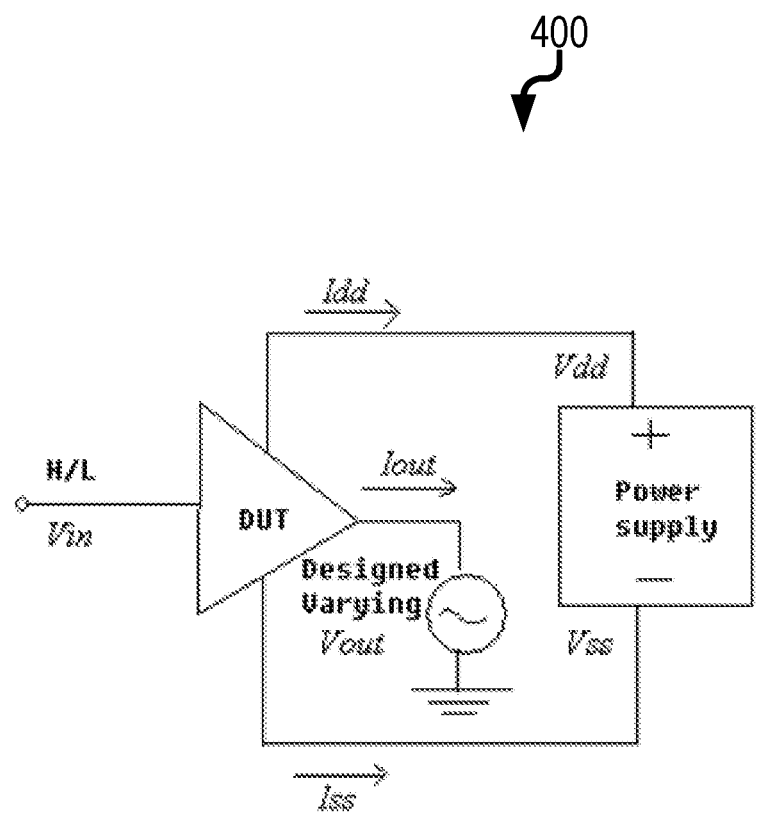
FIG. 4 depicts an example dynamic data generation model.

FIG. 4 depicts a dynamic data generation model 400 used to generate training data to train the state space model of the above-described dynamic current sub-model 230. To obtain the outputs of the dynamic data generation model 400, SPICE simulation parameters are set as follows: (i) Voltage input, $V_{in}$, into a DUT is set to a constant value using high/low logic, (ii) the DUT is connected with power supply voltage, $V_{dd}$, and voltage output, $V_{out}$, (iii) power supply voltage, $V_{dd}$, is fixed to an ideal voltage value, and (iv) voltage output, $V_{out}$, is a designed varying waveform covering a possible output range. Using these SPICE simulation parameters, a total dynamic current, $I_{dy}$ (including $I_{out\_dy}$, $I_{dd\_dy}$ and $I_{ss\_dy}$), by PG and signal current is obtained. A data set comprising $I_{dy}$ and $V_{out}$ are used as training data to train the state space model of the dynamic current sub-model 230.

Figure 5:
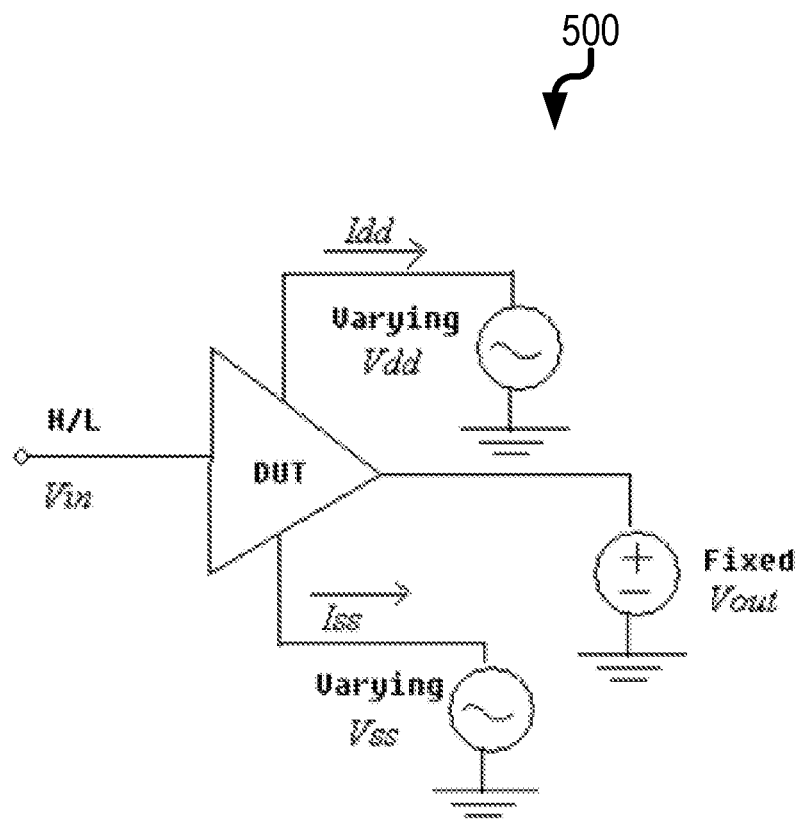
FIG. 5 depicts another example dynamic data generation model.

FIG. 5 depicts another dynamic data generation model 500 used to generate training data used to train the state space model of the dynamic current sub-model 230. To obtain the outputs of the dynamic data generation model 500, SPICE simulation parameters are set as follows: (i) voltage input, $V_{in}$, is set to either a high or low voltage level, (ii) the DUT is separately connected to the voltage output, $V_{out}$, power supply voltage, $V_{dd}$, and ground supply voltage, $V_{ss}$, (iii) PG voltage is a designed varying waveform covering possible range, (iv) Vout is a fixed Voltage (e.g., Vdd when Low input, or Vss when High input). Using these SPICE simulation parameters, a transient dynamic current, $I_{dy\_pg}$ at Power and Ground (PG) pins, the power supply voltage, $V_{dd}$, and the ground supply voltage, $V_{ss}$ are obtained. The PG pins connect the power and ground pin delivery network to provide power and ground supply for the DUT. A data set comprising $I_{dy\_pg}$, $V_{dd}$, and $V_{ss}$ comprise training data used to train the state space model of the dynamic current sub-model 230.

Figure 6A:
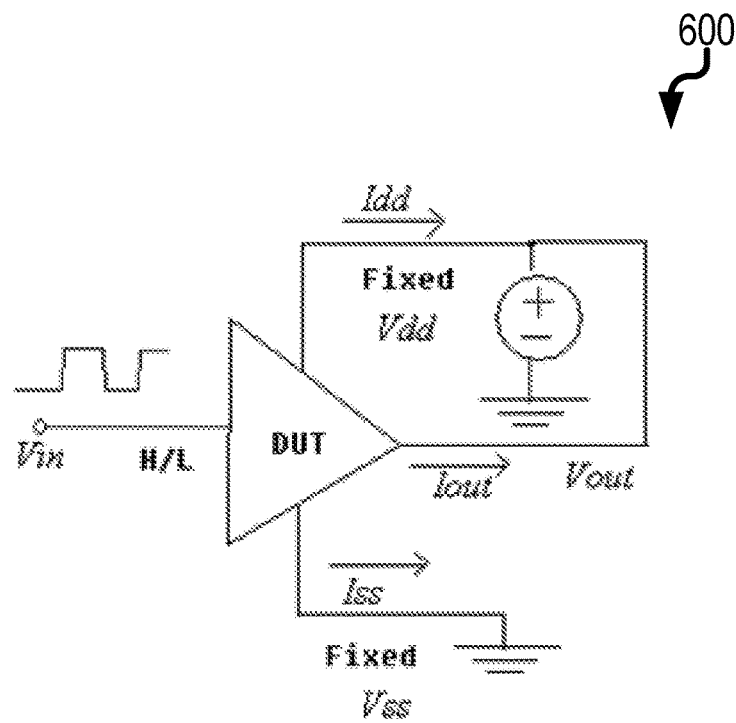
FIG. 6A depicts an example switching signal data generation model.

FIG. 6A depicts a switching signal data generation model 600 used to generate training data to train the artificial neural network model of the above-described switching signal sub-model 210 and switching noise sub-model 240. To obtain the outputs of the switching signal data generation model 600, SPICE simulation parameters are set as follows: (i) voltage input, $V_{in}$, is set to either a high or low voltage level and (ii) the DUT is separately connected to the ground supply voltage, $V_{dd}$, and ground. A transient current, $I_{sn}$, at PG pins is obtained. A data set comprising $I_{sn}$ comprise training data used to train the artificial neural network model of the switching signal sub-model 210 and switching noise sub-model 240.

Figure 6B:
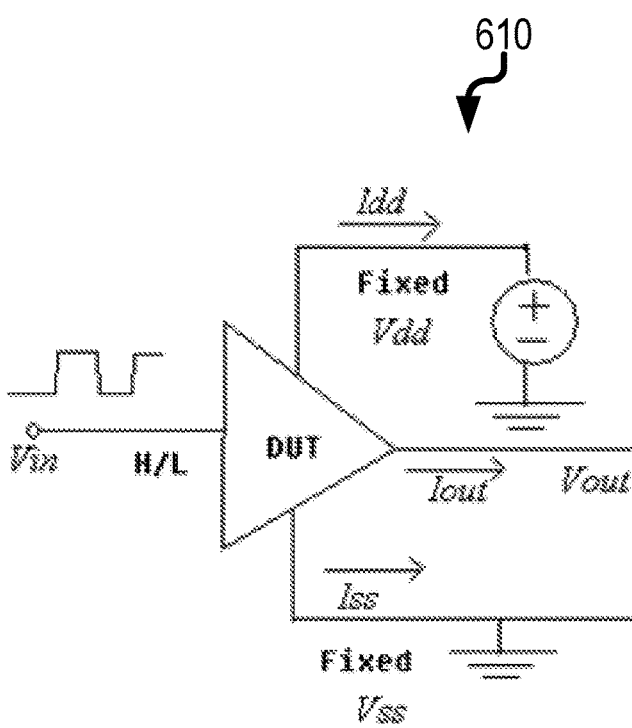
FIG. 6B depicts an example switching noise data generation model.

FIG. 6B depicts a switching signal data generation model also used to generate training data to train the artificial neural network model of the above-described switching signal sub-model 210 and switching noise sub-model 240. To obtain the outputs of the switching signal data generation model 600, SPICE simulation parameters are set as follows: (i) voltage input, $V_{in}$, is set to either a high or low voltage level, and (ii) the DUT is separately connected to the ground supply voltage, $V_{dd}$, and ground. A transient current, $I_{sn}$, at PG pins is obtained. A data set comprising $I_{sn}$ comprise training data used to train the artificial neural network model of the switching signal sub-model 210 and switching noise sub-model 240.

Figure 7A:
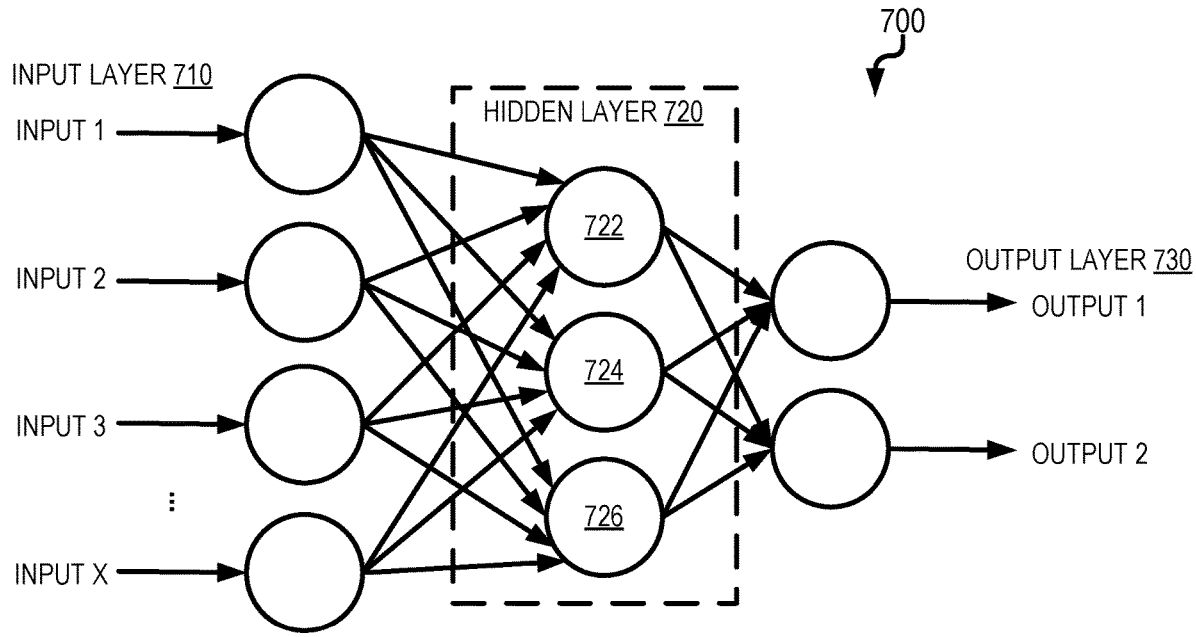
FIG. 7A depicts an example artificial neural network.

FIG. 7A depicts an example artificial neural network 700. Each of the above-described sub-models switching signal sub-model 210, static DC sub-model 220, and switching noise sub-model 240 comprises an artificial neural network 700, such as that illustrated in FIG. 7A. The artificial neural network 700 may be a feed forward artificial neural network such as a Multilayer Perceptron (MLP). As a feed forward artificial neural network does not account for output feedback, the possibility of simulation divergence is lower than those models with output feedback such as a recurrent neural network. The artificial neural network 700 includes, in embodiments, input layer 710, hidden layer 720, and output layer 730. The number of inputs belonging to input layer 710 can vary based on the number of available inputs into the sub-model. Each input provides signals to each hidden layer element (i.e., 722, 724, and 726) of hidden layer 720. Each hidden layer element (i.e., 722, 724, and 726) provides signals to each output of outputs 730.

Figure 7B:
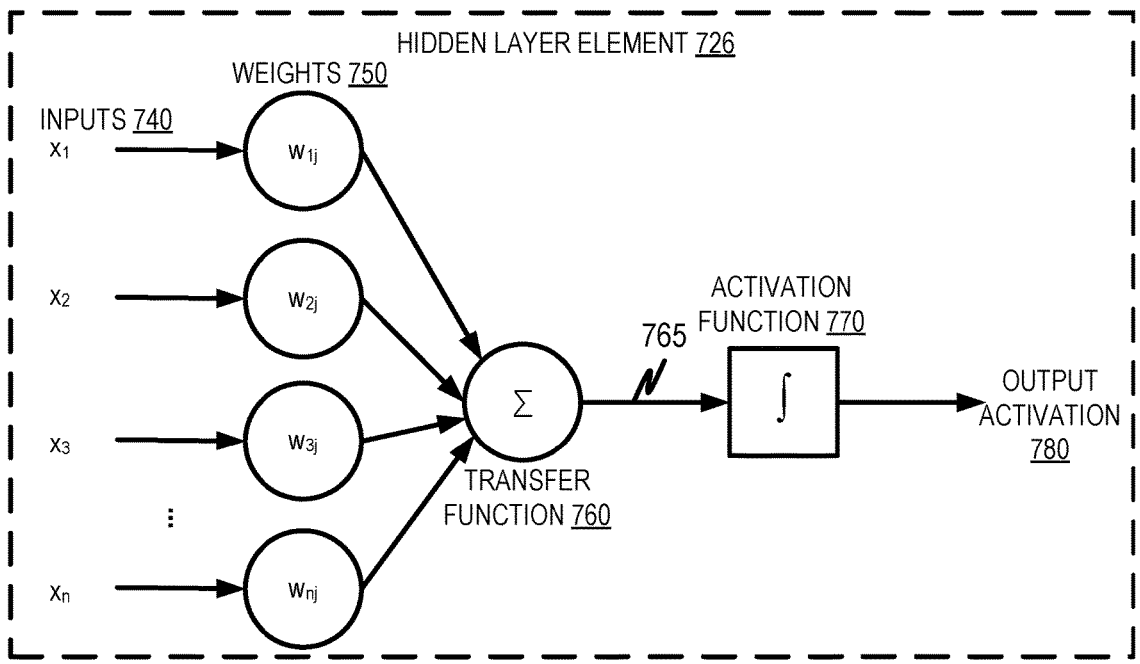
FIG. 7B is an example hidden layer element.

FIG. 7B is an example hidden layer element 726. Hidden layer element 726 receives inputs 740 based on input layer 710. Corresponding weights 750 are applied to each input 740. Summation function 760 is applied to a combination of the weighed inputs. Activation function 770 is applied to a transfer function output 765. An activation function, for example, can be a sigmoid function such as:

$$S(t) = \frac{1}{1+e^{-t}}, \quad (3)$$

where t is the transfer function output 765. An output activation 780 is supplied to output layer 730.

As described above, the dynamic current sub-model 230 comprises a state space model, in embodiments. The state space model of the dynamic current sub-model 230 may be based on the following equations:

$$z(k+1)=A_i z(k)+B_i u(k), \text{ and} \qquad (4)$$

$$y(k)=C_i z(k)+D_i u(k) \qquad (5)$$

where: u(k) is a column matrix vector of inputs (i.e., [$V_{out}$; $V_{dd}$; $V_{ss}$]); y(k) is a single element matrix of outputs (i.e., $I_{out}$, $I_{dd}$ or $I_{ss}$); z(k) is a state vector, and $A_i$, $B_i$, $C_i$, $D_i$ are model parameters trained using a gradient based algorithm. A gradient based optimization strategy iteratively searches an optimum set of model parameters $A_i$, $B_i$, $C_i$, $D_i$, in order to minimize the difference between state-space system output and training data.

Figure 8:
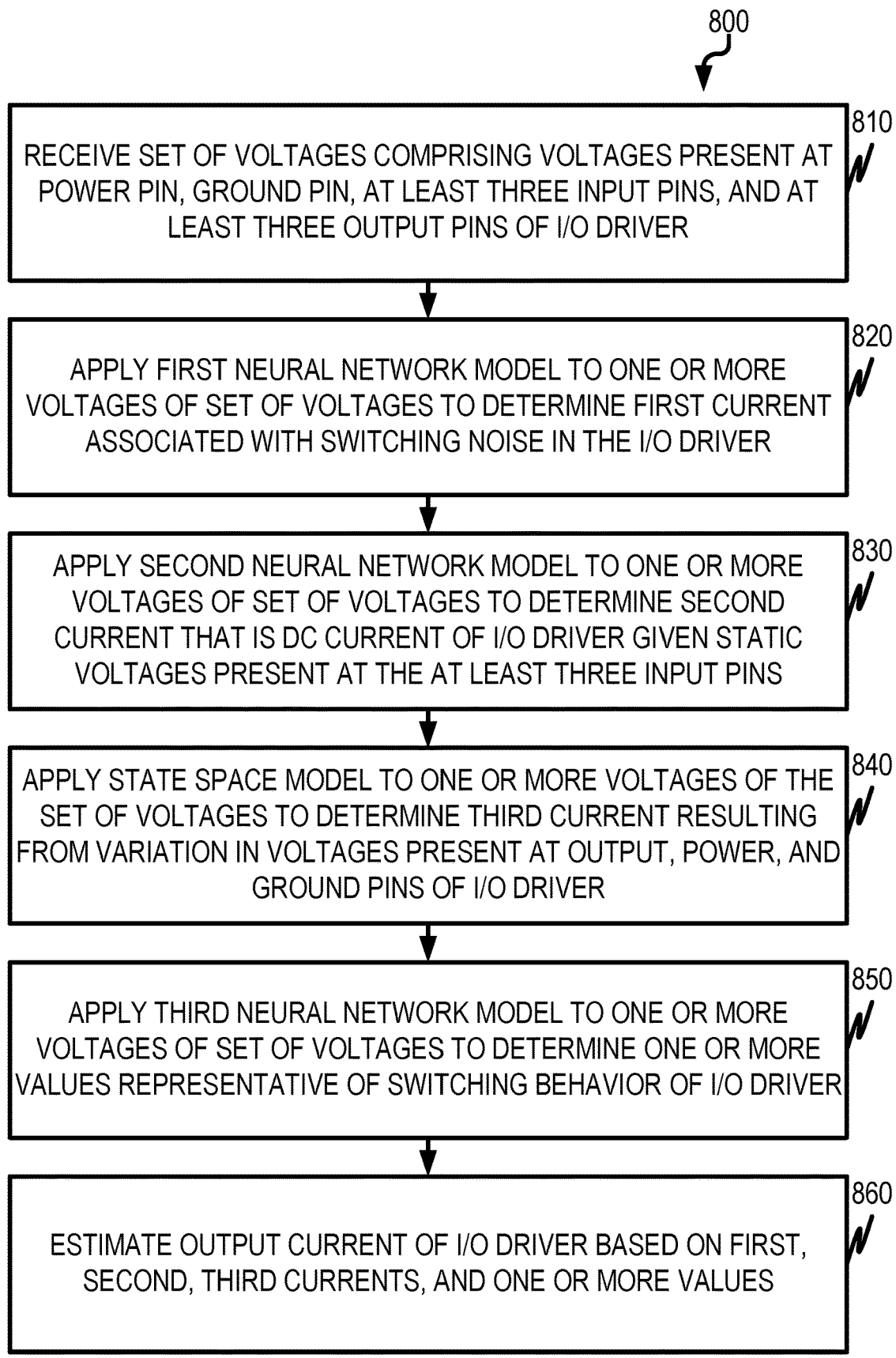
FIG. 8 depicts an example process flow diagram for transistor driver cell modeling using artificial neural networks and state space models.

FIG. 8 depicts an example process flow diagram 800 for estimating an output current of an input/output (I/O) driver given a set of voltages present at pins of the I/O driver. A set of voltages is received, at 810, comprising voltages present at a power pin, a ground pin, at least three input pins, and at least three output pins of the I/O driver. In one example, these input voltages are based on measured voltages applied to a real-world integrated circuit. A first neural network model is applied, at 820, to one or more voltages of the set of voltages to determine a first current associated with a switching noise of the I/O driver. A second neural network model is applied, at 830, to one or more voltages of the set of voltages to determine a second current that is a DC current of the I/O driver given static voltages are present at the at least three input pins. A state space model is applied, at 840, to one or more voltages of the set of voltages to determine a third current resulting from a variation in voltages present at the power, ground, and at least three output pins of the I/O driver. A third neural network model is applied, at 850, to one or more voltages of the set of voltages to determine one or more values representative of switching behavior of the I/O driver. In one embodiment, the neural networks are trained based on data obtained through observation of real-world, physical integrated circuits. An output current of the I/O driver is estimated, at 860, based on the first, second, and third currents and the one or more values. Based on the estimated output current, a design of a real-world, physical integrated circuit is adjusted and that real-world, physical integrated circuit is fabricated or adjusted accordingly.

Figure 9:
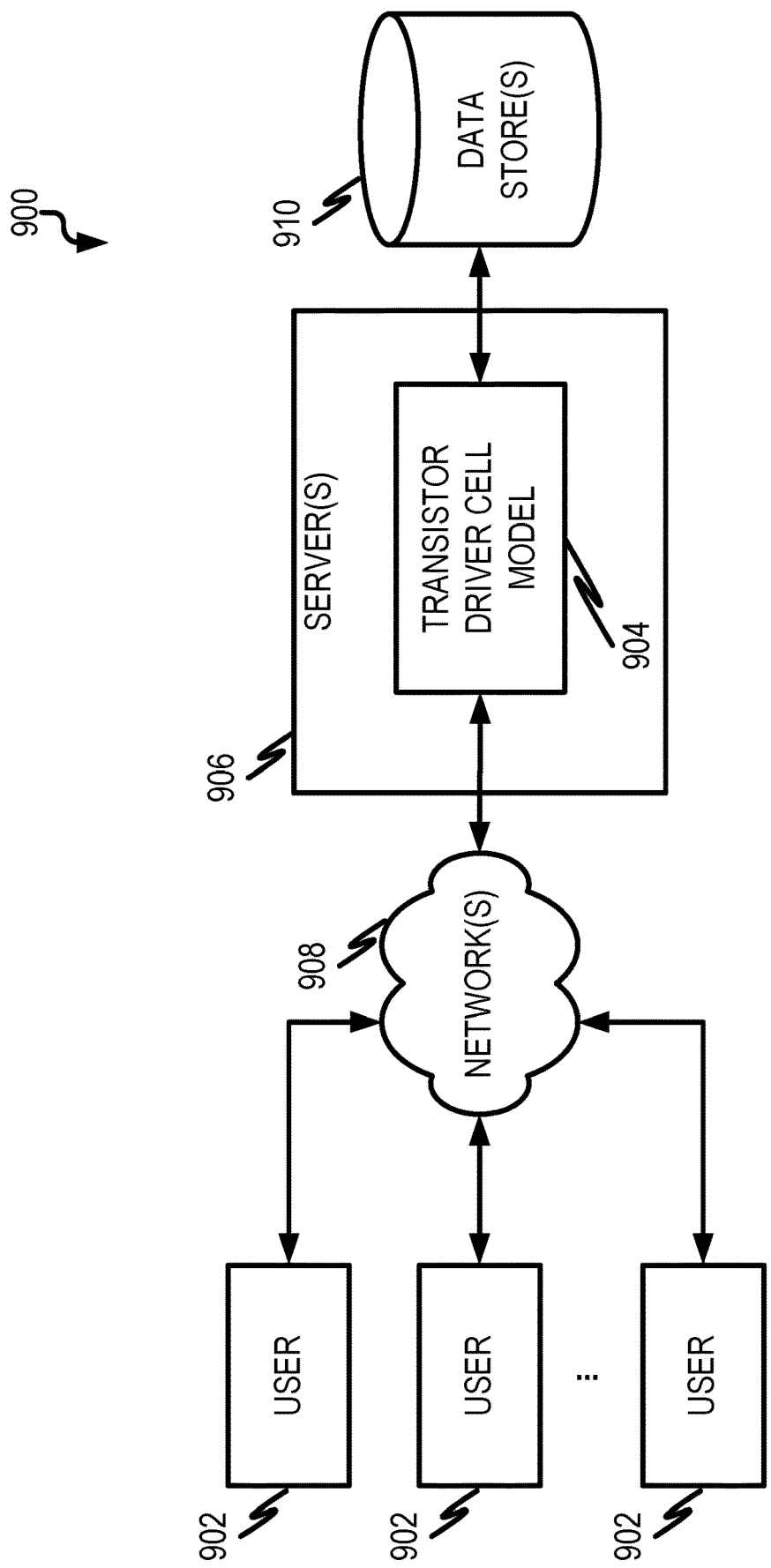
FIG. 9 depicts an example computer-implemented environment.

FIG. 9 depicts an example computer-implemented environment 900 wherein users 902 can interact with a transistor driver cell model 904 hosted on one or more servers 906 through a network 908. The transistor driver cell model 904 can assist the users 902 with modeling the behavior of a transmitter driver cell.

As shown in FIG. 9, the users 902 can interact with the transistor driver cell model 904 through a number of ways, such as over one or more networks 908. One or more servers 906 accessible through the network(s) 908 can host the transistor driver cell model 904. The one or more servers 906 can also contain or have access to one or more data stores 910 for storing data for the transistor driver cell model 904.

Figure 10:
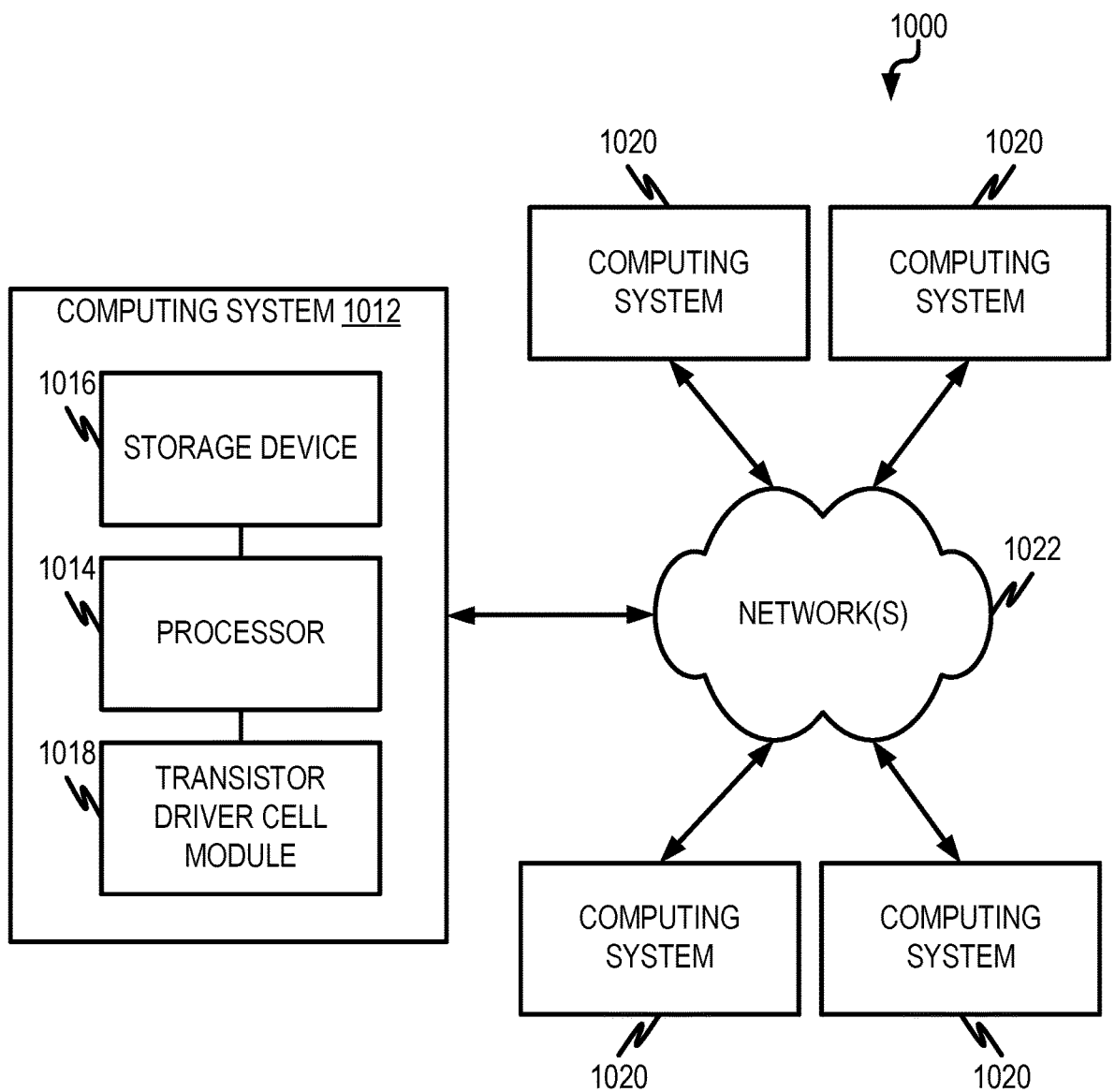
FIG. 10 depicts an example diagram showing a system for transistor driver cell modeling.

FIG. 10 depicts an example diagram showing a system 1000 for transistor driver cell modeling. As shown in FIG. 10, the system 1000 includes a computing system 1012 which contains a processor 1014, a storage device 1016, and a transistor driver cell module 1018. The computing system 1012 includes any suitable type of computing device (e.g., a server, a desktop, a laptop, a tablet, a mobile phone, etc.) that includes the processor 1014 or provides access to a processor via a network 1022 or as part of a cloud based application. The transistor driver cell module 1018 includes tasks and is implemented as part of a user interface module (not shown in FIG. 10).

Figure 11:
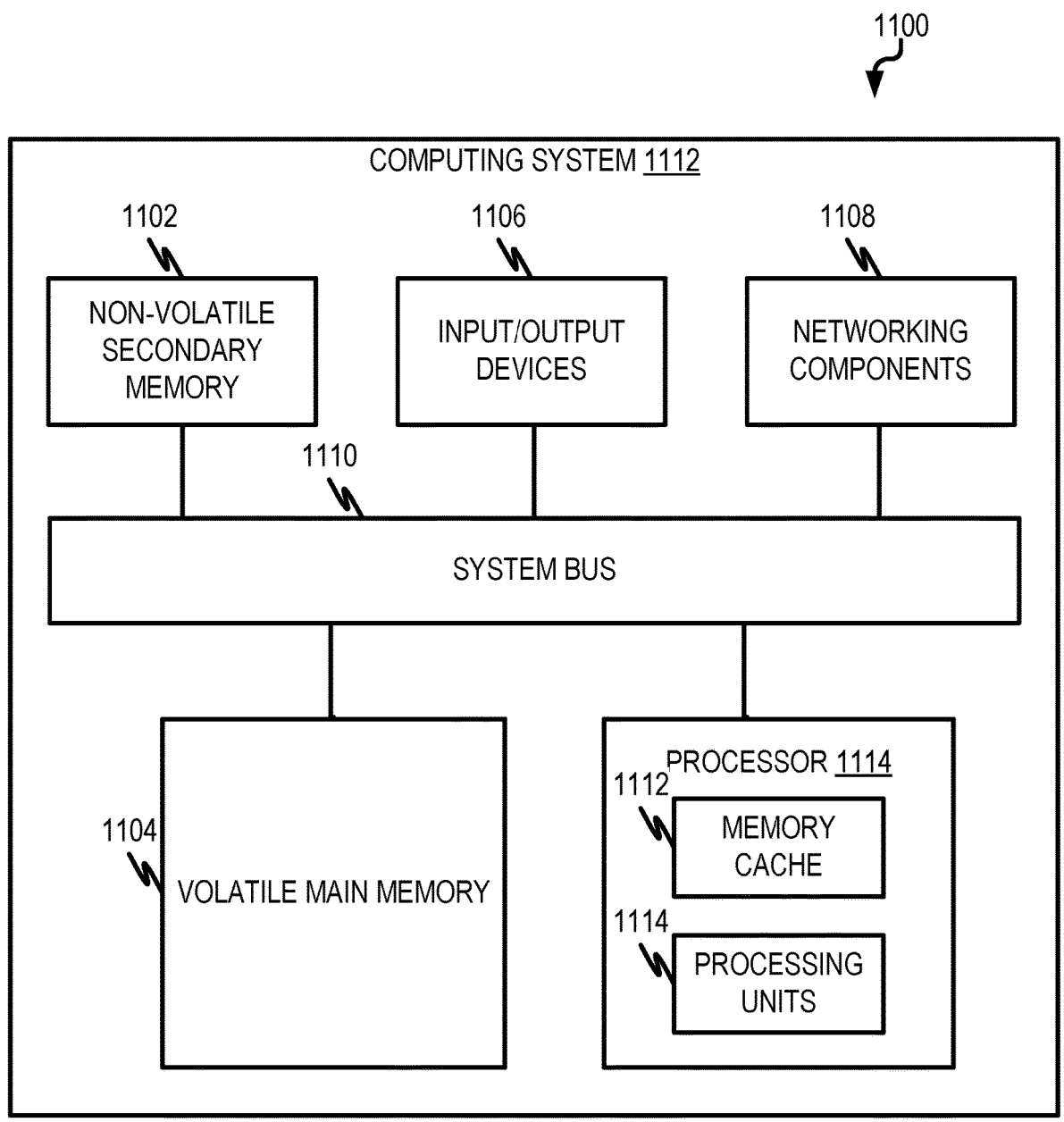
FIG. 11 depicts an example diagram showing a computing system for transistor driver cell modeling.

FIG. 11 depicts an example diagram 1100 showing a computing system 1112 for transistor driver cell modeling. As shown in FIG. 11, the computing system 1112 includes a processor 1114, memory devices 1102 and 1104, one or more input/output devices 1106, one or more networking components 1108, and a system bus 1110. The processor 1114 can include a memory cache 1112 and/or one or more processing units 1114. In some embodiments, the computing system 1112 includes the transistor driver cell module 1118, and provides access to the transistor driver cell module 1118 to a user as a stand-alone computer.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system can include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, can include machine instructions for a programmable processor, and/or can be implemented in a high-level procedural language, an object-oriented programming language, a functional programming language, a logical programming language, and/or in assembly/machine language. As used herein, the term "computer-readable medium" refers to any computer program product, apparatus and/or device, such as for example magnetic discs, optical disks, solid-state storage devices, memory, and Programmable Logic Devices (PLDs), used to provide machine instructions and/or data to a programmable data processor, including a machine-readable medium that receives machine instructions as a computer-readable signal. The term "computer-readable signal" refers to any signal used to provide machine instructions and/or data to a programmable data processor. The computer-readable medium can store such machine instructions non-transitorily, such as for example as would a non-transient solid-state memory or a magnetic hard drive or any equivalent storage medium. The computer-readable medium can alternatively or additionally store such machine instructions in a transient manner, such as for example as would a processor cache or other random access memory associated with one or more physical processor cores.

The computer components, software modules, functions, data stores and data structures described herein can be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality can be located on a single computer or distributed across multiple computers depending upon the situation at hand.

Figure 12:
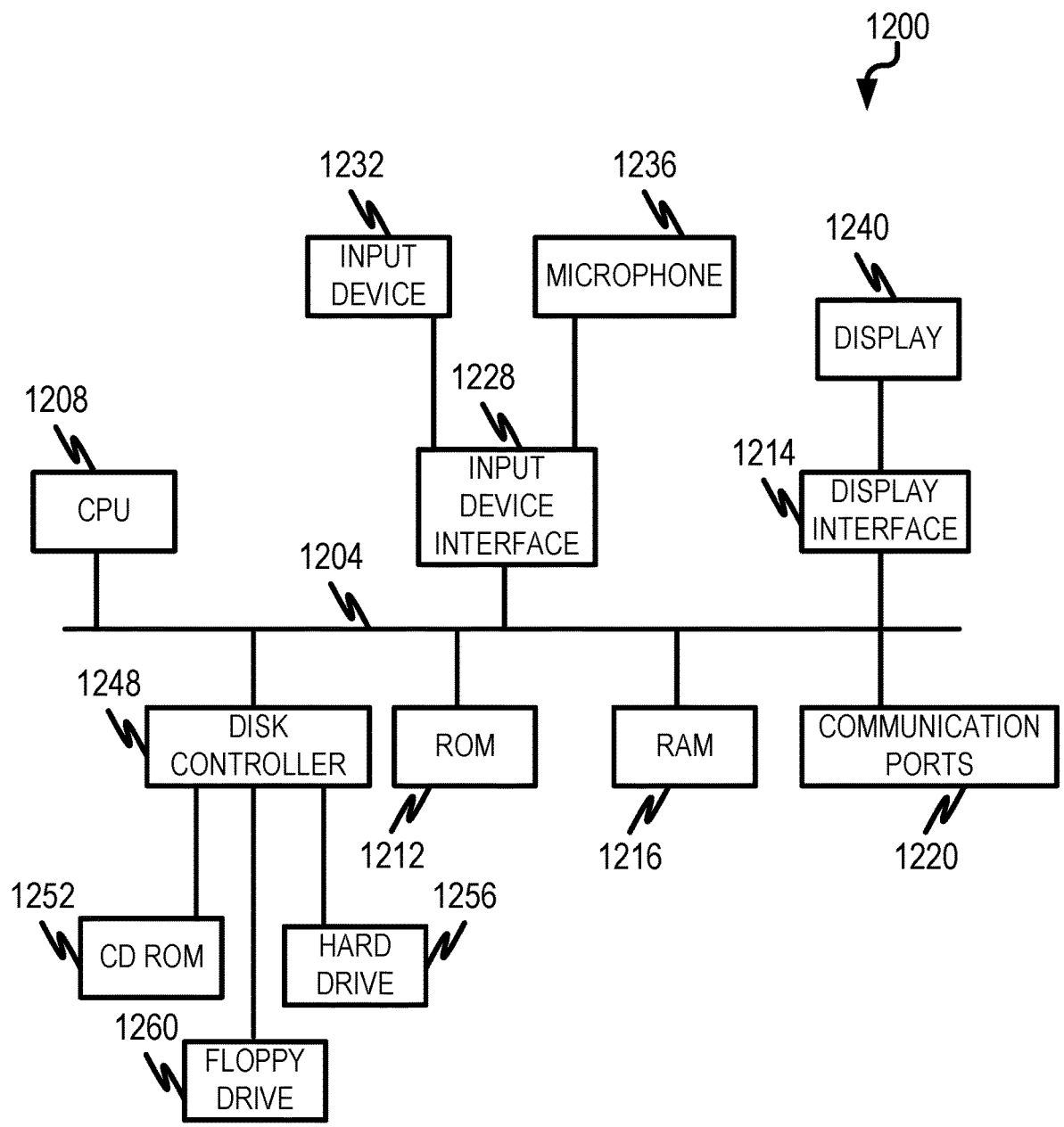
FIG. 12 is a diagram illustrating a sample computing device architecture for implementing various aspects described herein.

FIG. 12 is a diagram 1200 illustrating a sample computing device architecture for implementing various aspects described herein. A bus 1204 can serve as the information highway interconnecting the other illustrated components of the hardware. A processing system 1208 labeled CPU (central processing unit) (e.g., one or more computer processors/data processors at a given computer or at multiple computers), can perform calculations and logic operations required to execute a program. A non-transitory processor-readable storage medium, such as read only memory (ROM) 1212 and random access memory (RAM) 1216, can be in communication with the processing system 1208 and can include one or more programming instructions for the operations specified here. Optionally, program instructions can be stored on a non-transitory computer-readable storage medium such as a magnetic disk, optical disk, recordable memory device, flash memory, or other physical storage medium.

In one example, a disk controller 1248 can interface one or more optional disk drives to the system bus 1204. These disk drives can be external or internal floppy disk drives such as 1260, external or internal CD-ROM, CD-R, CD-RW or DVD, or solid state drives such as 1252, or external or internal hard drives 1256. As indicated previously, these various disk drives 1252, 1256, 1260 and disk controllers are optional devices. The system bus 1204 can also include at least one communication port 1220 to allow for communication with external devices either physically connected to the computing system or available externally through a wired or wireless network. In some cases, the communication port 1220 includes or otherwise comprises a network interface.

To provide for interaction with a user, the subject matter described herein can be implemented on a computing device having a display device 1240 (e.g., a CRT (cathode ray tube) or LCD (liquid crystal display) monitor) for displaying information obtained from the bus 1204 to the user and an input device 1232 such as keyboard and/or a pointing device (e.g., a mouse or a trackball) and/or a touchscreen by which the user can provide input to the computer. Other kinds of input devices 1232 can be used to provide for interaction with a user as well; for example, feedback provided to the user can be any form of sensory feedback (e.g., visual feedback, auditory feedback by way of a microphone 1236, or tactile feedback); and input from the user can be received in any form, including acoustic, speech, or tactile input. In the input device 1232 and the microphone 1236 can be coupled to and convey information via the bus 1204 by way of an input device interface 1228. Other computing devices, such as dedicated servers, can omit one or more of the display 1240 and display interface 1214, the input device 1232, the microphone 1236, and input device interface 1228.

In the descriptions above and in the claims, phrases such as "at least one of" or "one or more of" can occur followed by a conjunctive list of elements or features. The term "and/or" can also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

For example, the systems and methods may include data signals conveyed via networks (e.g., local area network, wide area network, internet, combinations thereof, etc.), fiber optic medium, carrier waves, wireless networks, etc. for communication with one or more data processing devices. The data signals can carry any or all of the data disclosed herein that is provided to or from a device.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of non-transitory computer-readable storage medium that is stored at a single location or distributed across multiple locations. The medium can include computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example, as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate situation where only the disjunctive meaning may apply.

The invention claimed is:

1. A computer-implemented method for estimating an output current of an input/output (I/O) driver given a set of voltages present at pins of the I/O driver, the method comprising:
    receiving a set of voltages comprising voltages present at a power pin, a ground pin, at least three input pins, and at least three output pins of an I/O driver;
    applying a first neural network model to one or more voltages of the set of voltages to determine an accumulated current due to a transmitter cell driver's previous stages switching;
    applying a second neural network model to one or more voltages of the set of voltages to determine a current with input voltage being static high and a current with input voltage being static low;
    applying a state space model to one or more voltages of the set of voltages to determine a current resulting from variation in the voltages present at the power, ground, and at least three output pins of the I/O driver;
    applying a third neural network model to one or more voltages of the set of voltages to determine one or more values representative of a switching behavior of the I/O driver; and
    estimating an output current of the I/O driver based on the accumulated current, the current resulting from variation in the voltages, the current with input voltages being static high, the current with input voltage being static low, and the one or more values, wherein the output current is estimated as a weighted combination of the accumulated current, the current resulting from variation in the voltages, the current with input voltage being static high, and the current with input voltage being static low, the combination weighted according to the one or more values representative of the switching behavior of the I/O driver.

2. The method according to claim 1, wherein the output current is determined based on a summation operation.

3. The method according to claim 1, wherein the I/O driver is a C-PHY I/O driver.

4. The method according to claim 1, wherein one of the first, second, or third neural network models includes an input layer, a hidden layer, and an output layer.

5. The method according to claim 4, wherein the hidden layer includes a plurality of hidden layer elements, each hidden layer element determines an output activation signal provided to the output layer.

6. The method according to claim 5, wherein the output activation signal is determined by application of an activation function to a weighted transfer function output based on inputs to each hidden layer element.

7. The method according to claim 6, wherein the activation function is a sigmoid function.

8. The method according to claim 1, wherein the state space model determines a plurality of model parameters using a gradient-based algorithm.

9. The method according to claim 1, wherein the estimating occurs in a simulation environment.

10. The method of claim 1, wherein a design of a real-world physical integrated circuit is adjusted based on the estimated output current, and wherein a real-world physical integrated circuit is fabricated based on that adjusted design.

11. The method of claim 1, wherein one or more of the first, second, and third neural networks are trained based on data obtained from observation of real-world physical integrated circuits.

12. A system for estimating an output current of an input/output (I/O) driver given a set of voltages present at pins of the I/O driver, the system comprising:
    at least one data processor; and
    memory storing instructions which, when executed by the at least one data processor, result in operations comprising:
        receiving a set of voltages comprising voltages present at a power pin, a ground pin, at least three input pins, and at least three output pins of an I/O driver;
        applying a first neural network model to one or more voltages of the set of voltages to determine an accumulated current due to a transmitter cell driver's previous stages switching;
        applying a second neural network model to one or more voltages of the set of voltages to determine a current with input voltage being static high and a current with input voltage being static low;
        applying a state space model to one or more voltages of the set of voltages to determine a current resulting from variation in the voltages present at the power, ground, and at least three output pins of the I/O driver;
        applying a third neural network model to one or more voltages of the set of voltages to determine one or more values representative of a switching behavior of the I/O driver; and
        estimating an output current of the I/O driver based on the accumulated current, the current resulting from variation in the voltages, the current with input voltages being static high, the current with input voltage being static low, and the one or more values, wherein the output current is estimated as a weighted combination of the accumulated current, the current resulting from variation in the voltages, the current with input voltage being static high, and the current with input voltage being static low, the combination weighted according to the one or more values representative of the switching behavior of the I/O driver.

13. The system according to claim 12, wherein the output current is determined based on a summation operation.

14. The system according to claim 13, wherein the I/O driver is a C-PHY I/O driver.

15. The system according to claim 11, wherein one of the first, second, or third neural network models includes an input layer, a hidden layer, and an output layer.

16. The system according to claim 15, wherein the hidden layer includes a plurality of hidden layer elements, each hidden layer element determines an output activation signal provided to the output layer.

17. The system according to claim 16, wherein the output activation signal is determined by application of an activation function to a weighted transfer function output based on inputs to each hidden layer element and wherein the activation function is a sigmoid function.

18. The system according to claim 11, wherein the state space model determines a plurality of model parameters using a gradient-based algorithm.

19. The system according to claim 11, wherein the estimating occurs in a simulation environment.

20. A non-transitory computer readable storage media storing instructions which, when executed by at least one data processor, result in operations comprising:
receiving a set of voltages comprising voltages present at a power pin, a ground pin, at least three input pins, and at least three output pins of an I/O driver;
applying a first neural network model to one or more voltages of the set of voltages to determine a first current associated with switching noise in the I/O driver, the first current including an accumulated current due to a transmitter cell driver's previous stages switching;
applying a second neural network model to one or more voltages of the set of voltages to determine a second current that is a DC current of the I/O driver given static voltages present at the at least three input pins, the DC current including a current with input voltage being static high and a current with input voltage being static low;
applying a state space model to one or more voltages of the set of voltages to determine a third current resulting from variation in the voltages present at the power, ground, and at least three pins of the I/O driver;
applying a third neural network model to one or more voltages of the set of voltages to determine one or more values representative of a switching behavior of the I/O driver; and
estimating an output current of the I/O driver based on the accumulated current, the current resulting from variation in the voltages, the current with input voltages being static high, the current with input voltage being static low, and the one or more values, wherein the output current is estimated as a weighted combination of the accumulated current, the third current resulting from variation in the voltages, the current with input voltage being static high and the current with input voltage being static low, the combination weighted according to the one or more values representative of the switching behavior of the I/O driver.

21. The non-transitory computer readable media according to claim 20, wherein the estimating occurs in a simulation environment.

22. The non-transitory computer readable media according to claim 20, wherein the I/O driver is a C-PHY I/O driver.

* * * * *